United States Patent [19]

Phang et al.

[11] Patent Number: 5,264,704
[45] Date of Patent: Nov. 23, 1993

[54] HIGH EFFICIENCY CATHODOLUMINESCENCE DETECTOR WITH HIGH DISCRIMINATION AGAINST BACKSCATTERED ELECTRONS

[75] Inventors: Jacob C. H. Phang; Daniel S. H. Chan; Kin L. Pey, all of Singapore, Singapore

[73] Assignee: National University of Singapore, Singapore

[21] Appl. No.: 977,840

[22] Filed: Nov. 17, 1992

[51] Int. Cl.$^5$ .......................................... H01J 37/244
[52] U.S. Cl. ..................... 250/347; 250/306; 250/310
[58] Field of Search ........................ 250/397, 310, 306

[56] References Cited

U.S. PATENT DOCUMENTS 4,900,932 2/1990 Schäfer et al. .................... 250/397

OTHER PUBLICATIONS

J. Marek, R. Geiss, L. M. Glassman and M. P. Scott, "A novel scheme for detection of defects in III-V semiconductors by Cathodoluminescence," Journal Electrochemistry Society, vol. 132, 1985, pp. 1502-1504.
A. Boyde and S. A. Reid, "A new method of scanning electron microscopy for imaging biological tissues," Nature, vol. 302, 1983, pp. 322-323.

Primary Examiner—Paul M. Dzierzynski
Assistant Examiner—Kiet T. Nguyen
Attorney, Agent, or Firm—Birch, Stewart, Kolasch & Birch

[57] ABSTRACT

A parabolic light reflection device in a cathodoluminescence (CL) apparatus is integrated with a photosensitive solid state device mounted on a supporting plate, and supported in an electron microscope vacuum chamber specimen stage by an adaptor element. These components are optically aligned with respect to one another and a readily exchangeable unit is thus obtained. Designed for CL emission operation in an electron microscope, the parabolic light reflection device and the photosensitive solid state detection device are optically aligned and then mounted on a supporting plate of the photosensitive solid state device. The unit thus configured is supported by the specimen stage adaptor element to obtain a mechanical element which can be easily inserted in and removed from any standard electron microscope vacuum chamber stage as a single integrated unit.

15 Claims, 2 Drawing Sheets

HIGH EFFICIENCY CATHODOLUMINESCENCE DETECTOR WITH HIGH DISCRIMINATION AGAINST BACKSCATTERED ELECTRONS

FIELD OF THE INVENTION

This invention relates generally to a cathodoluminescence device and more particularly to a cathodoluminescence detector exhibiting relatively high efficiency and high discrimination against signals due to backscattered electrons.

BACKGROUND OF THE INVENTION

While cathodoluminescence (CL) detectors are generally known, in conventional CL detectors using a solid-state detector as the detection element, the photodiodes are positioned inside the electron microscope vacuum chamber either on the side of the specimen or above it. A glass cover, normally coated with a very thin sputtered layer of indium-tin oxide, is therefore placed in front of the solid-state detector to reject backscattered electrons that can also contribute to the detector signal. The sputtered conductive and optically transparent thin layer on the glass is used to prevent a charging phenomenon from taking place. However, the glass cover in front of the solid-state detector can itself actually be a powerful CL emitter. This means that the glass can act as an extremely efficient converter of backscattered electrons to light which would be detected by the solid-state photodiode; however, the backscatter in prior art apparatus bears little or no relationship to the specimen under observation. Such detectors, moreover, lack portability and have generally been designed so as to be dedicated exclusively to suit the particular type of electron microscope vacuum chamber with which it is used. This invention overcomes the above mentioned drawbacks.

SUMMARY

Accordingly, it is the primary objective of this invention to combine a parabolic light reflection device with the photo-sensitive solid state detection device in a cathodoluminescence detector which can easily be mounted and removed from the vacuum chamber specimen stage of an electron microscope. The detector, moreover, includes a generally flat photosensitive element mounted on a supporting plate in the same plane as the specimens under investigation so that backscattered electrons from the specimen will not strike the photosensitive area of the photosensitive element and will be effectively absorbed by the parabolic light reflector.

BRIEF DESCRIPTION OF THE DRAWINGS

The invention will be more readily understood when considered in conjunction with the accompanying drawings wherein.

Figure schematically discloses an electron microscope including a cathodoluminescence detector in accordance with the subject invention.

DETAILED DESCRIPTION OF THE INVENTION

Figure 1:
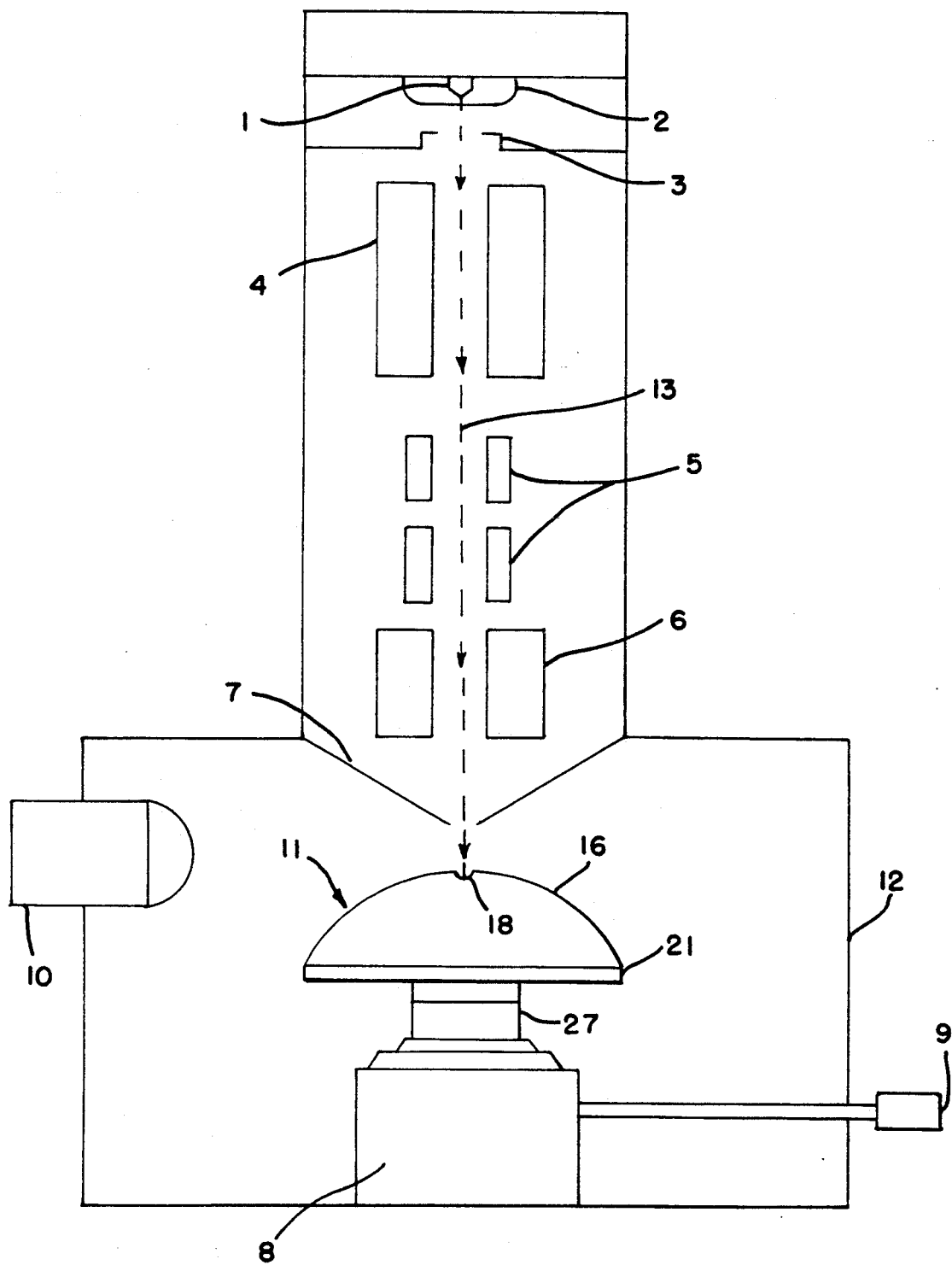

Referring now collectively to the drawings, an electron microscope is shown in FIG. I comprising an electron emitter or cathode a Wehnelt cylinder electrode 2, an anode 3, a beam adjustment system 4, a beam scanning system 5, a final lens 6, a lower pole piece 7 of the final lens, a specimen stage 8 with its adjustment device 9, an electron detector 10 and a cathodoluminescence detector 11 in accordance with this invention. All elements are located in an electron microscope housing 12.

Figure 2:
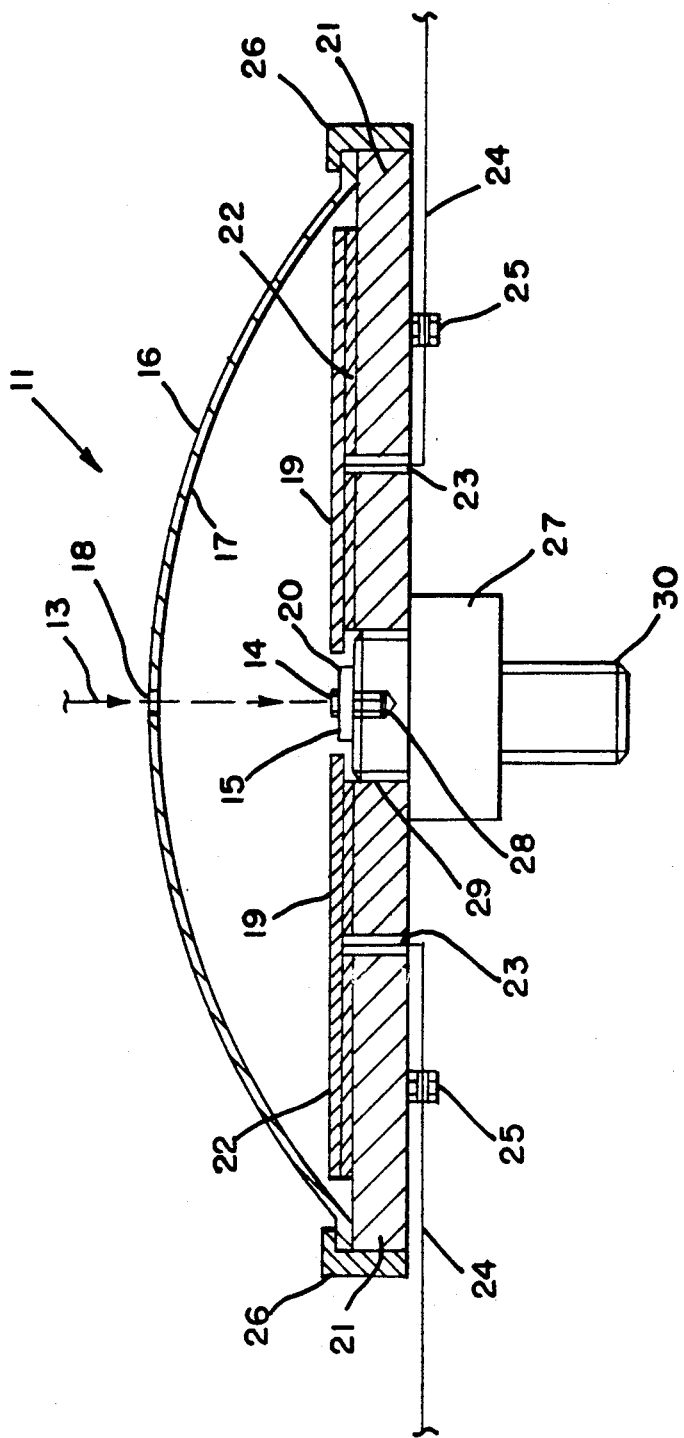
FIG. 2 is a central transverse cross section illustrating the details of the detector shown in FIG. 1.

In normal operation of the electron microscope, the electron beam 13 emitted by the cathode I will irradiate a specimen 14, shown in FIG. 2, arranged on a specimen stub 15 so that radiation due to interaction with the specimen can be detected. The specimen 14 is scanned by the electron beam 13. Transmitted, reflected and/or secondary electrons or other radiations generated by the interaction between the electron beam 13 and the specimen 14 are typically detected by detection system shown by reference numeral 10, to which a video monitor system, not shown in the figure, is connected. The detection system 10, however, plays no part in the subject invention, the details of which will now be described.

In FIG. 2, a parabolic light reflector 16 is shown having a shiny interior concave surface 17 for light reflection. This can be achieved by either a coating of a thin film of aluminum on a parabolic cup, a fine surface finish on an aluminum parabolic cup, or an industrial grade piece of aluminum foil formed in the shape of a parabolic mirror with the shiny side as its internal surface. A central opening 18 is provided on top of the reflector 16 for the passage of the scanning electron beam 13. A photosensitive solid state device 19 comprised of either a photodiode having an annular form with an opening 20 at its center or two or more small devices, not shown, positioned around the opening 20. The photosensitive device 19 sits on an electrically conductive cell holder 21 comprising a flat plate having a central opening 29 by means of an electrically insulating intermediate piece 22 fabricated, for example, from a ceramic material. The photosensitive solid state device 19 is positioned at the same level or slightly below the top surface of the specimen 14. Thus backscattered electrons from the specimen 14 will not strike the photosensitive area of the device 19 directly and therefore most of them will be effectively absorbed by the parabolic light reflector 16.

A pair of small aligned openings 23 are formed in both the cell holder 21 and the insulating material 22 through which two well shielded electrical signal leads 24 carrying the detected signals from the photosensitive element 19 and coupled to an amplifying circuit (not shown). The cell 19 is secured in position by means of a pair of clamp/screw connection devices 25 at the signal leads 24 beneath the holder 21.

The parabolic light reflector 16 and the cell holder 21 are rigidly held together by means of a peripheral clamp 26 so as to form a mechanically integrated unit. The top opening 18 in the parabolic reflector 16, consisting of a circle of about 5 mm in diameter, and the photosensitive detector element 19 are concentric with respect to the central optical axis which is also coincident with the electron beam 13. This mounting configuration results in a high collection efficiency of the reflected light by the photosensitive element 19.

Also included is a specimen stage adaptor unit 27 which is a specially machined base member. The member 27 is provided with a centralized threaded bore 28 into which the specimen stub 15 for holding the specimen 14 can be inserted and tightened. The specimen stage adaptor unit 27 and the integrated parabolic light reflector/photosensitive cell unit 11 can be interconnected by means of the central opening 29 which comprises a screw threaded hole formed in the cell holder 21, thus providing a unitary device. Such a construction results in a device having a suitably electrically conductive path for electron discharge. Should backscattered electrons be collected by the electrically conductive parabolic reflector 16, they can be discharged to the electron microscope ground through the same discharge path so that charging problems are eliminated. The entire unit thus formed can be retrofitted to any standard electron microscope vacuum chamber housing 12 by means of a single threaded stud 30 without any modification.

The mounting and removal of the cathodoluminescence apparatus in accordance with the embodiment shown and described herein is similar to that for a normal specimen loading or exchange operation. The loading and unloading of the specimen 14 is realized simply by removing the base member 27 from the cell holder 21.

The parabolic light reflector 16 and the photosensitive device 19 together with its supporting plate 21 being mechanically and rigidly connected, can be easily and accurately positioned with respect to one another. The specific design of the parabolic light reflector 16 will enable the efficient reflection of CL signals from the specimen 14 perpendicularly towards the photodevice 19. Furthermore, the small hole 18 on the top of the parabolic light reflector 16, which provides an unobstructed and clear passage for the incoming electron beam 13 from the electron emitter I, will result in a light collection angle in the order of $2\pi$ steradians.

The embodiment of the subject invention can thus be repeatedly mounted and removed from an electron microscope without any modifications to the electron microscope being required. It should be noted the entire unit including the specimen moves together during adjustment. The optical alignment will not present a problem once it is adjusted during the assembly stage. Its simplicity makes the time taken to set up the detector effectively similar to that needed for a normal specimen loading or exchanging operation. In this way the electron microscope can be returned to its other tasks speedily without compromising its normal functions.

Having thus shown and described what is considered to be the preferred method and embodiment for implementing the subject invention, it is to be noted that the same has been made by way of illustration and not limitation. Accordingly, all modifications, alterations and changes coming within the spirit and scope of the invention as set forth in the appended claims are herein meant to be included.

We claim:

1. Cathodoluminescence detector apparatus for the vacuum chamber specimen stage of an electron microscope being used for cathodoluminescence microscopy and analysis, comprising:
   a) a base member for mounting the apparatus in said vacuum chamber specimen stage;
   b) at least one photosensitive member responsive to radiation emitted from a specimen being scanned by an electron beam of the electron microscope;
   c) means secured to said base member for supporting said at least one photosensitive member;
   d) means for coupling a detection signal from said at least one photosensitive member;
   e) means secured to said base member for supporting the specimen; and
   f) parabolic reflector means located adjacent said specimen and said at least one photosensitive member and having a concave reflective surface for reflecting radiation emitted from said specimen to said photosensitive member and absorbing backscattered electrons from said specimen.

2. The apparatus of claim 1 wherein said at least one photosensitive member comprises a planar member and wherein said specimen is generally coplanar with said photosensitive member.

3. The apparatus of claim 2 wherein said parabolic reflector means includes an aperture for permitting the electron beam to impinge on said specimen.

4. The apparatus of claim 3 wherein said aperture comprises a central aperture.

5. The apparatus of claim 4 and additionally including electrical insulator means located between said at least one photosensitive member and said means for supporting said photosensitive member.

6. The apparatus of claim 5 wherein said at least one photosensitive member comprises an annular member including a central opening and wherein said specimen is located in said central opening.

7. The apparatus of claim 5 wherein said means for supporting said at least one photosensitive member and said electrical insulator means includes at least one mutually aligned hole therein for connecting said means for coupling a detection signal to the underside surface of said at least one photosensitive member.

8. The apparatus of claim 2 wherein said at least one photosensitive member comprises a plurality of coplanar photosensitive members.

9. The apparatus of claim I wherein said base member comprises a specimen stage adaptor unit including a first body member for supporting said specimen, a second body member for supporting said means for supporting said at least one photosensitive member and a third body member projecting from said second body member for attachment to said vacuum chamber specimen stage.

10. The apparatus of claim 9 wherein said first body member includes means for receiving a specimen stub which operates to support said specimen.

11. The apparatus of claim 10 wherein said means for receiving the specimen stub comprises a threaded bore.

12. The apparatus of claim 9 wherein said third body member comprises a threaded stud.

13. The apparatus of claim 9 wherein said means for supporting said at least one photosensitive member comprises a flat annular plate including a central aperture through which said third body projects.

14. The apparatus of claim 1 and additionally including means for attaching said parabolic reflector means to said means for supporting said at least one photosensitive member.

15. The apparatus of claim 14 wherein said means for attaching comprises means for securing a peripheral edge of said parabolic reflector means to said means for supporting said at least one photosensitive means.

* * * * *